(12) United States Patent
Kondo

(10) Patent No.: US 6,677,670 B2
(45) Date of Patent: Jan. 13, 2004

(54) SEMICONDUCTOR DEVICE

(75) Inventor: Yoichiro Kondo, Chino (JP)

(73) Assignee: Seiko Epson Corporation, Tokyo (JP)

( * ) Notice: Subject to any disclaimer, the term of this patent is extended or adjusted under 35 U.S.C. 154(b) by 136 days.

(21) Appl. No.: 09/843,236

(22) Filed: Apr. 25, 2001

(65) Prior Publication Data

US 2003/0151127 A1 Aug. 14, 2003

(30) Foreign Application Priority Data

Apr. 25, 2000 (JP) ........................................ 2000-124354

(51) Int. Cl.$^7$ ............................................... H01L 23/02
(52) U.S. Cl. ...................................... 257/686; 257/723
(58) Field of Search ................................ 257/678, 685, 257/686, 713, 723, 730, 777, 773; 438/107, 110, 109, 125; 361/749, 720, 735, 721, 784, 790

(56) References Cited

U.S. PATENT DOCUMENTS

| 5,117,282 A | * | 5/1992 | Salatino ...................... 257/686 |
| 5,170,328 A | * | 12/1992 | Kruppa | |
| 5,345,205 A | * | 9/1994 | Kornrumpf ................... 333/246 |
| 5,776,797 A | * | 7/1998 | Nicewarner, Jr. et al. ... 438/107 |
| 6,014,316 A | * | 1/2000 | Eide ............................ 361/735 |
| 6,172,418 B1 | * | 1/2001 | Iwase .......................... 257/723 |
| 6,208,521 B1 | * | 3/2001 | Nakatsuka ................... 361/749 |
| 2001/0015487 A1 | * | 8/2001 | Forthun ....................... 257/685 |

* cited by examiner

*Primary Examiner*—Tom Thomas
*Assistant Examiner*—Douglas L. Owens
(74) *Attorney, Agent, or Firm*—Hogan & Hartson, LLP

(57) ABSTRACT

A flexible circuit substrate 11 has mounting regions 111, 112 and 113 on which electronic components 121, 122 and 123 are mounted, respectively. The flexible circuit substrate 11 is structured in such a manner that the mounting regions 111–113 are folded on top of the other over the base region 110 in a predetermined order (f1–f3). An integrated spacer 13 is superposed and affixed to the flexible circuit substrate and supports the electronic components 121–123 when the mounting regions 111–113 are folded on top of the other. The integrated spacer 13 has thick regions 131 and thin regions 132.

21 Claims, 6 Drawing Sheets

SEMICONDUCTOR DEVICE

TECHNICAL FIELD

The present invention relates to a semiconductor device using a flexible circuit substrate, and more particularly to a semiconductor device having a three-dimensional mounting module that is inexpensive, smaller in size, and lighter in weight.

BACKGROUND TECHNOLOGY

Flexible circuit substrates have the advantage of being soft and deformable unlike rigid circuit substrates. Accordingly, they are advantageous in high-density mounting of ICs and reducing the size of modules. In other words, flexible circuit substrates are used for TCP (tape carrier packages), COP (Chip On Flexible or Film) and the like, and particularly they are indispensable for reducing the size of a variety of media apparatuses.

Also, the system LSI (Large-Scale integration) technology is important in the realization of smaller, thinner and lighter media apparatuses. System LSIs are steadily advancing the technology towards the implementation of one-chip while incorporating LSIs of peripheral circuits. However, the development of a system LSI requires a long time and results in an increased cost of the chip because of mixing of processes of different types. For this reason, requirements for a short delivery time and low cost for media apparatuses have not been met.

For the reasons described above, there are stronger demands in system function mounting mainly composed of three-dimensional mounting, and integration of a system LSI and the mounting technology is becoming more important. Frequency (high speed) and delivery (short-term delivery) determine the degree of growth in the media apparatus industry. Accordingly, the connection length and wiring length of an LSI to be built in must be shortened as much as possible by utilizing the mounting and packaging technologies. For this reason, three-dimensional mounting modules have been subject to various contrivances and have come into the stage of practical use.

For example, conventionally, a three-dimensional mounting module has the following structure that has been placed in practice or in the stage of being placed in practice. First, (A): TCPs (Tape Carrier Packages) are stacked in layers, and connection between the stacked chip layers are achieved by outer leads of the TCPs. (B): A frame body for wiring is disposed between layers of TCPs, and connection between the layers of the TCPs is achieved by the frame body. (C): Chips are stacked in layers, and the stacked chip layers are connected by conduction material. Also, other techniques are available.

According to the conventional technology, stacked chip layers need to be electrically connected through certain interposers. The interposers may have a connection structure in which they are externally connected in a manner described above in (A) or (C), or a connection structure in which they are internally connected in a manner described above in (B). In any of the cases, a structure as a three-dimensional mounting module needs to be established first, then the electrical operation thereof as a module product is made and measurement and examination thereof can be conducted.

If a three-dimensional mounting module is determined to be defective as a result of the measurement and examination, repair work (or re-work) to correct the defect is conducted. In other words, in a three-dimensional mounting module in the process of assembling a three-dimensional structure, it is important to provide a connection structure, which takes into consideration processes of how common electrodes and non-common electrodes are treated and how repair works (re-words) are conducted. In this respect, the conventional technology has the problem of longer processing time and higher costs.

The present invention has been made in view of the problems described above, and it is an advantage of the present invention to provide a semiconductor device having a three-dimensional mounting module structure using a flexible circuit substrate that is excellent for repairing and assembling the module into a three-dimensional structure.

SUMMARY OF THE INVENTION

A semiconductor device in accordance with the present invention includes a flexible circuit substrate having a base region and one or more mounting regions continuously provided at a peripheral edge of the base region, wherein the mounting regions are folded over the base region; electronic components mounted corresponding to the mounting regions; a stacked layered support body including a thick first region and a foldable thin second region that is formed with the first region in one piece, each of the regions having a specified outer frame provided to protect each of the electronic components; and a bonding member for affixing the stacked layered support body with the flexible circuit substrate in one piece in such a manner that the electronic components mounted on the flexible circuit substrate are stacked in layers.

In accordance with the semiconductor device of the present invention, at the time when the electronic components are mounted on the flexible circuit substrate, an operation as a module product can be conducted. Accordingly, measurement and examination can be conducted before they are assembled into a three-dimensional mounting module.

Furthermore, the stacked layered support body for assembling a three-dimensional mounting module is formed in one piece and mounted on the flexible circuit substrate in one area. Then, the mounting regions are folded and affixed together with the stacked layered support body on top of the other. As a result, a three-dimensional mounting module is realized in a fewer number of steps.

DETAILED DESCRIPTION OF THE PREFERRED EMBODIMENTS

Figure 1:
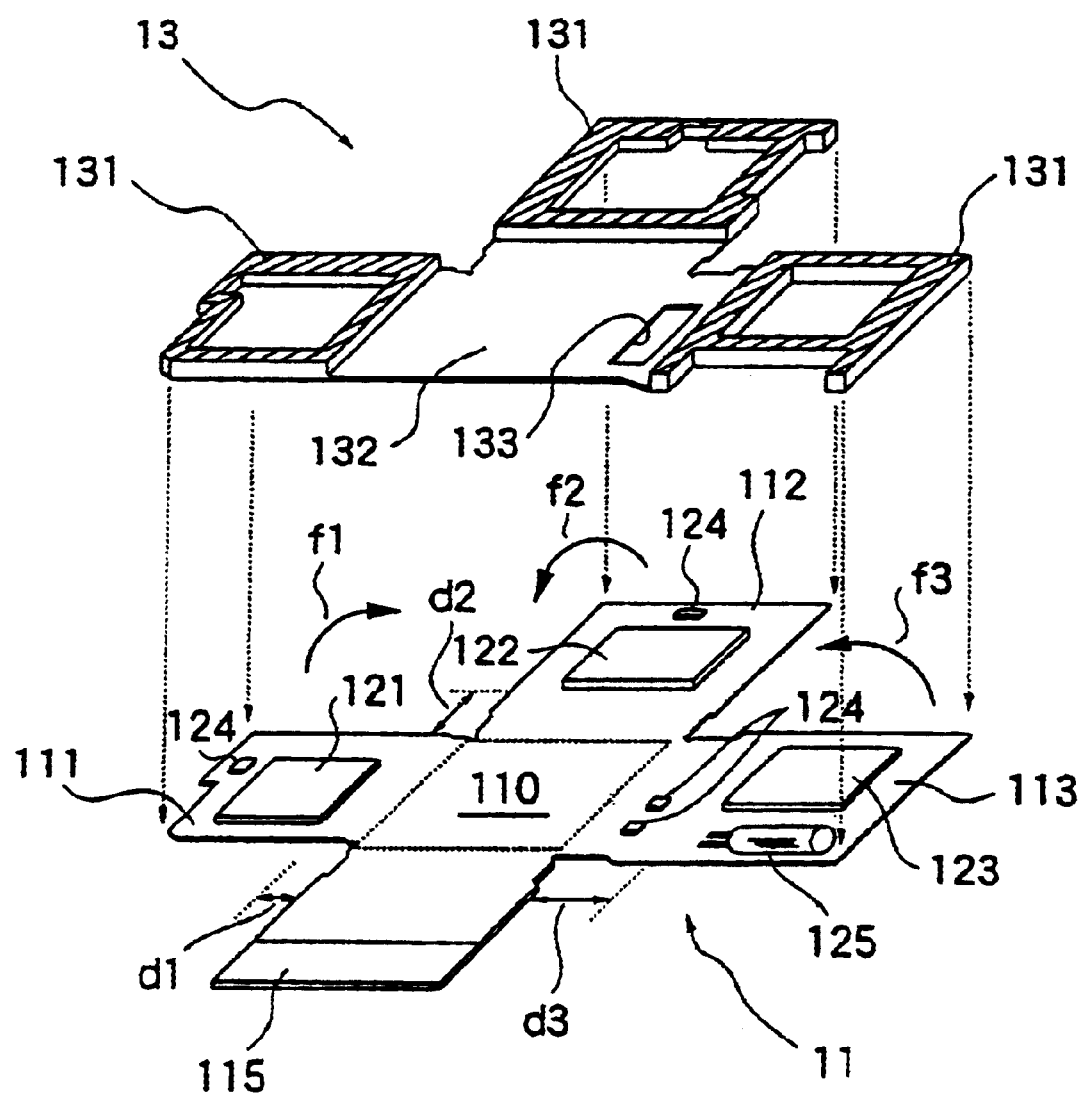
FIG. 1 shows a prospective view of a structure of a semiconductor device in accordance with a first embodiment of the present invention.

FIG. 1 shows a prospective view of a structure of a semiconductor device in accordance with a first embodiment of the present invention. A flexible circuit substrate 11 has a generally square base region 110 indicated by broken lines, mounting regions 111, 112 and 113 that are continuously provided along the periphery of the base region 110, and predetermined conduction patterns (not shown) formed below a protection film. Also, an external terminal section 115 is provided at the periphery of the base region 110 in a region where the mounting regions are not provided. The external terminal section 115 in this example is a connector terminal.

In the flexible circuit substrate 11, electronic components 121, 122 and 123 respectively corresponding to the mounting regions 111, 112 and 113 are face-down mounted. The electronic components 121, 122 and 123 may be composed of any of various devices such as memory chips, system LSI chips, control units and the like.

The face-down mounting of the electronic components 121, 122 and 123 can be conducted by, for example, solder-bonding bump electrodes of each of the electronic components and predetermined conduction patterns on the flexible circuit substrate 11. Also, connection by an ACF (anisotropic conduction film) can be considered. More specifically, an ACF (anisotropic conduction film) is placed between the bump electrodes of each of the electronic components and the predetermined conduction patterns on the flexible circuit substrate 11 and they are heat-bonded together. As a result, conduction particles in the ACF achieve electrical connection between each of the electronic components 121, 122 and 123 and the conduction patterns on the flexible circuit substrate 11. In addition, a variety of other methods may be employed. For, example, ACP (anisotropic conduction paste) bonding, NCP (non-conductive paste) bonding that attains electrical connection by the shrinking force of an insulation resin, metal eutectic bonding of bumps between gold and gold, gold and tin or the like. Also, in some cases, a face-up mounting using the wire-bonding method can be applied. Furthermore, extremely thin IC packages can also be mounted. Therefore, electronic components are not limited to particular mounting configurations.

Also, some electronic components (peripheral elements) in small size relating to the electronic components 121, 122 and 123 are mounted. For example, electronic components 124 may be capacitors, chip resistors or the like, and an electronic component 125 may be a crystal or the like.

The flexible circuit substrate 11 is formed from a soft material such as polyimide that can be freely bent. The flexible circuit substrate 11 is formed such that the mounting regions 111–113 can be folded on top of the other in a predetermined order (f1–f3) over the base region 110. Therefore, distances d1–d3 are set different from one another in consideration of the bending distances required for bending the mounting regions 111–113.

An integrated spacer 13 is mounted on the flexible circuit substrate 11. The integrated spacer 13 is superposed over and affixed to the flexible circuit substrate as indicated by arrows with broken lines, such that they can support stacked layers of the electronic components when the mounting regions 111–113 are folded on top of the other. The integrated spacer 13 has thick regions 131 and a thin region 132.

The thick regions 131 of the integrated spacer 13 are provided to protect the stacked layers of the electronic components 121–123, and the other electronic components 124 and 125. Each of the thick regions 131 has a configuration that surrounds, for example, each of the corresponding electronic components 121–123, respectively. Also, with respect to the electronic component in small size (e.g., 125) mounted adjacent to an edge, it can have a configuration that partially extends along the periphery thereof. In any case, the thick regions 131 may preferably have outer frame shapes that can be superposed over the base region 110 since they are stacked over the base region 110.

The thin region 132 of the integrated spacer 13 extends over the base region 110, and is formed in one piece with the thick regions 131. The thin region 132 forms a region that can be bent at least along the periphery of the base region 110. Also, an opening section 133 may be provided such that mounting of the electronic component 124 is not prevented.

The integrated spacer 13 can be composed of a formed product of polyimide resin in consideration of heat resistance or a combination tape that is formed from a complex product having a plurality of two-faced tapes adhered to one another. The thick regions 131 have a thickness to the extent that the electronic components (121–123 and the like) to be mounted are not prevented from being stacked in layers. Also, the thin region 132 may preferably be as thin as possible because it includes a bending section, and may preferably have a thickness of about 0.1–0.2 mm, for example. If handling of the integrated spacer 13 is not difficult, the thin region 132 can be much thinner.

When the integrated spacer 13 is a formed product of polyimide resin, its rear surface (not shown) is affixed to the flexible circuit substrate 11 through a bonding member such as a two-faced tape, adhesive or the like. Furthermore, bonding members such as adhesive, two-faced tapes or the like are provided on stacking layer fixing sides (hatched areas) of the thick regions 131. As a result, when the electronic components 121–123 (including the other small-sized electronic components) are successively stacked in layers, they are affixed with respect to one another.

When the integrated spacer 13 is formed from a combination tape, its rear surface (not shown) is affixed to the flexible circuit substrate 11 through adhesive members of the two-faced tape. Furthermore, the stacking layer fixing sides (hatched areas) of the thick regions 131 are provided in advance with adhesion of the two-faced tape. As a result, when the electronic components 121–123 (including the other small-sized electronic components) are successively stacked in layers, they are affixed with respect one another.

Figure 2:
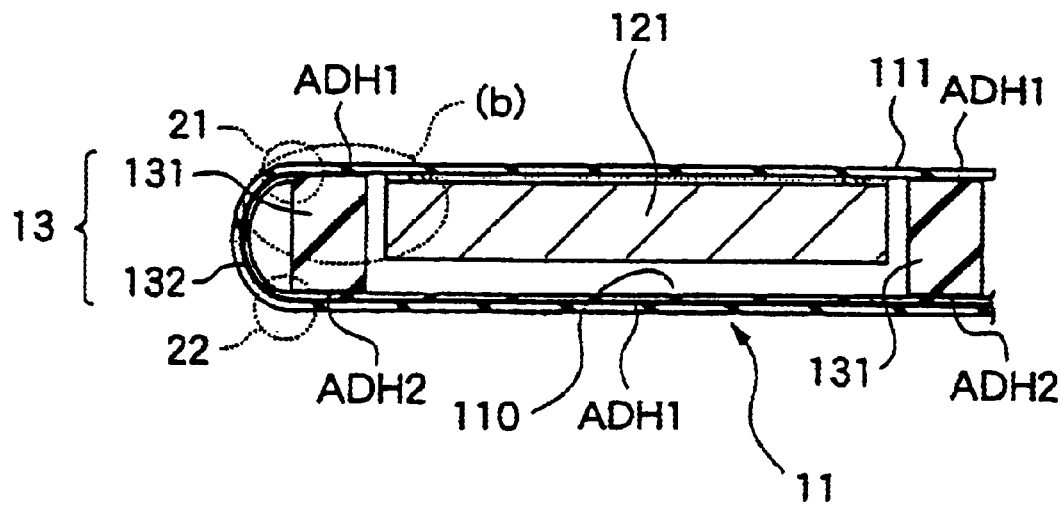
FIGS. 2 (*a*) and (*b*) show cross-sectional views in part of the semiconductor device of FIG. 1, respectively.
Figure 2:
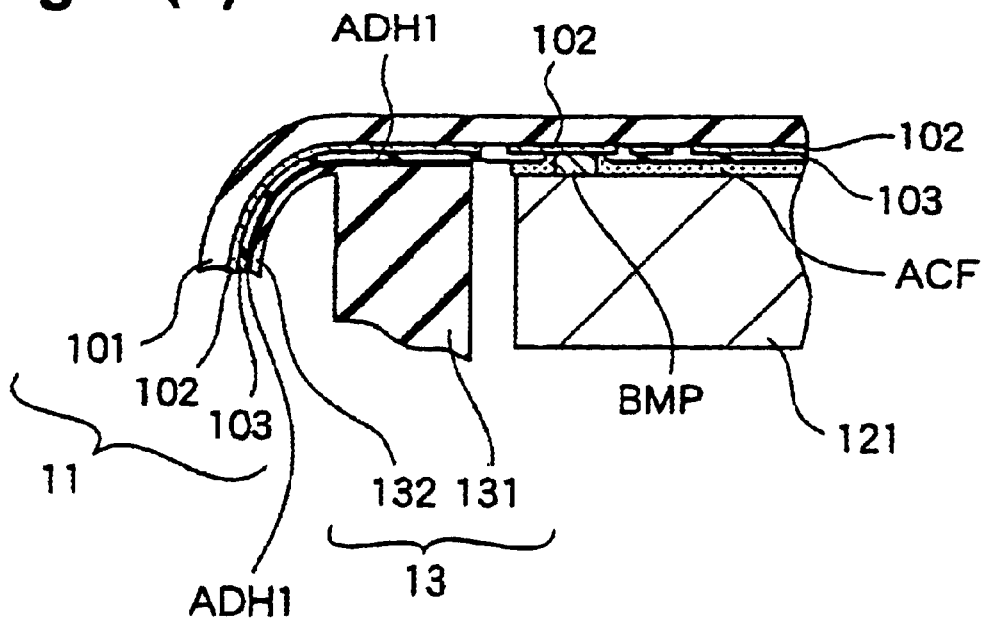

FIGS. 2 (*a*) and (*b*) show cross-sectional views in part of the semiconductor device of FIG. 1, respectively. The figure shows a configuration in which the mounting region 111 is bent such that the electronic component 121 is disposed over the base region 110. For mounting the electronic component 121, a mounting example using ACF (anisotropic conduction film) is shown. FIG. 2 (*b*) is an enlarged view showing a portion of FIG. 2 (*a*) in greater detail. Specifically, the flexible circuit substrate 11 is formed from a base material 101 of polyimide or the like and a conduction pattern 102 formed on the base material, and is protected by a resist layer 103.

A predetermined terminal section on the conduction pattern 102 is electrically coupled with respect to a bump electrode BMP on the electronic component 121 through an ACF (anisotropic conduction film).

As shown in FIG. 2 (a), the integrated spacer 13 has on its entire rear surface or a part thereof an adhesive region ADH1, and the rear surface is affixed to the flexible circuit substrate 11 through, for example, a two-faced tape or adhesive.

Furthermore, an adhesive region ADH2 is provided on the thick region 131 (hatched areas shown in FIG. 1) and is affixed to the base region 110 through a two-faced tape (or adhesive). The electronic component 121 shown in the figure is surrounded and protected by the thick region 131.

The thin region 132 of the integrated spacer 13 supports bending regions of the flexible circuit substrate 11, and plays a role of protecting the flexible circuit substrate 11 particularly with respect to its bending end regions 21 and 22 that can be sharply bent.

The mounting regions 112 and 113 are successively bent on top of the other such that the other electronic components 122 and 123 and the small sized electronic components 124 and 125 are disposed above the base region 110 in a similar manner as described above although not shown. As a result, the integrated spacer 13 and the flexible circuit substrate 11 are assembled together in one piece in which the electronic components (121–123 and the like) are stacked in layers, and the thick regions 131 of the integrated spacer 13 and the flexible circuit substrate (its rear surface) are affixed to each other by the two-faced tape or the like.

In accordance with the first embodiment of the present invention, at the time when the electronic components (121–123 and others) are mounted on the flexible circuit substrate 11, an operation as a module product can be conducted. Accordingly, measurement and examination can be conducted before they are assembled into a three-dimensional mounting module.

Moreover, the integrated spacer 13 that can be assembled into a three-dimensional mounting module can be mounted on the flexible circuit substrate 11 in one lot. Then, the mounting regions 111–113 together with the integrated spacer 13 are folded and fixed on top of the other to realize a three-dimensional mounting module of the electronic components (121–123 and others).

As a result, the assembly characteristic (readiness and accuracy in assembly) of a three-dimensional mounting module is substantially improved, and the number of work steps can be reduced. This results in an excellent workability in repair work (or re-work). The assembly characteristic is improved and the number of parts is reduced compared to spacers of a separated type. This contributes to the reduction of costs.

In the three-dimensional mounting module in accordance with the present invention, the electronic components (121–123 and others) are mounted on the flexible circuit substrate 11, and folded over on top of the other together with the flexible circuit substrate 11 and the integrated spacer 13. This configuration substantially loosens the restrictions on the size of ICs and placements of the pads, compared to a stacked package in which IC chips are stacked on top of the other. In a stacked package, there are a variety of restrictions on the size of ICs that are combined, IC terminal positions and the like. In contrast, a three-dimensional mounting module in accordance with the present invention has a greater degree of freedom in selection and combination of different types of ICs, and provides an electrically most optimized module in view of the fact that a plurality of peripheral elements can also be mounted.

Figure 3:
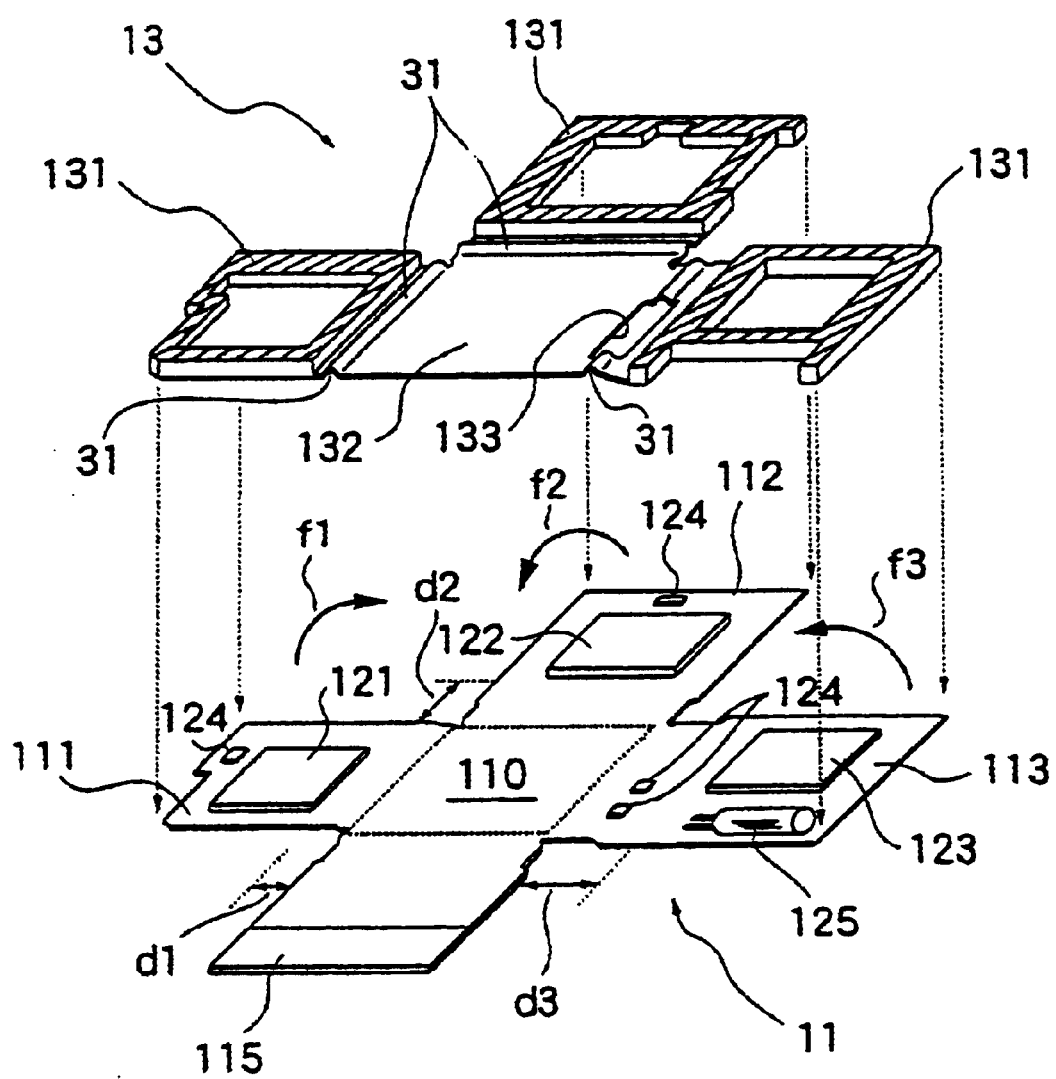
FIG. 3 shows a prospective view of a structure of a semiconductor device in accordance with a second embodiment of the present invention.

FIG. 3 shows a perspective view of the structure of a semiconductor device in accordance with a second embodiment of the present invention. The structure of an integrated spacer 13 is different from that of the first embodiment. A thin region 132 of the integrated spacer 13 is provided with a bend relieving section 31. In other words, in order to relieve a restoration force (a force to return to its original state) of the bending region of the flexible circuit substrate 11, a slacked region that achieves elasticity is formed. The bend relieving section 31 can be readily formed by a pressure relief method accompanied by thermal deformation. Other elements are the same as those of the first embodiment, and therefore they are referred to by the same reference numbers and the description thereof is omitted.

Figure 4:
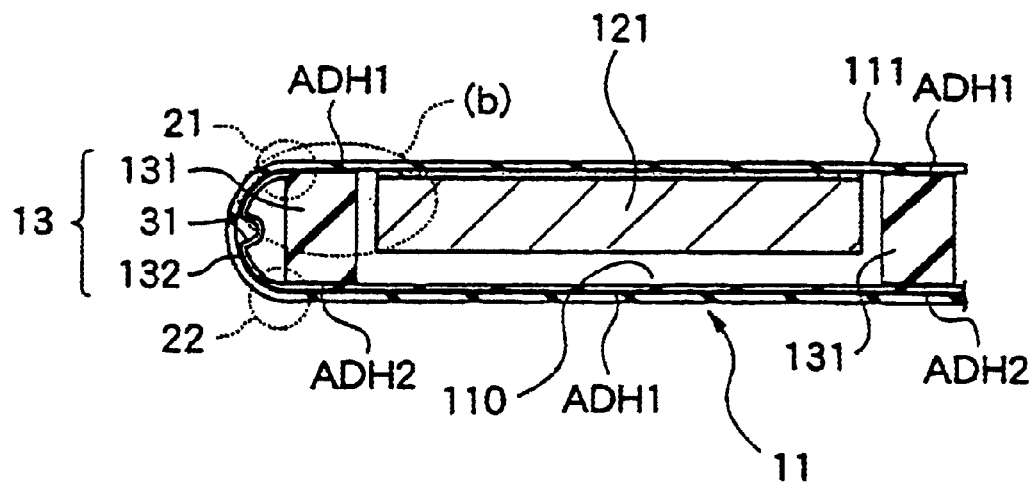
FIGS. 4 (*a*) and (*b*) show cross-sectional views in part of the semiconductor device of FIG. 3, respectively.
Figure 4:
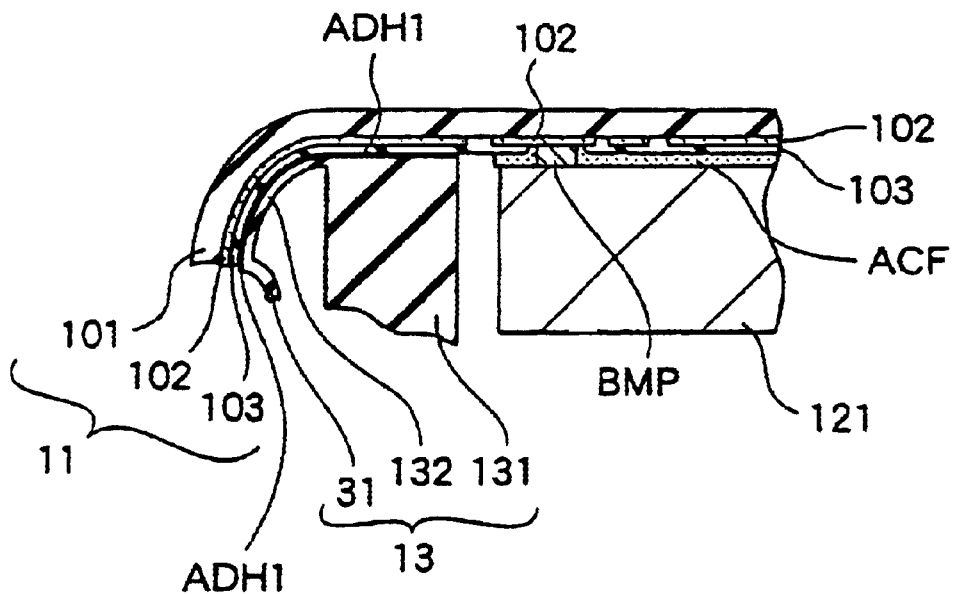

FIGS. 4 (a) and 4 (b) show cross-sectional views in part of the semiconductor device of FIG. 3, respectively. The figures show a configuration in which a mounting region 111 is bent such that the electronic component 121 is disposed over a base region 110. For mounting the electronic component 121, a mounting example using ACF (anisotropic conduction film) is shown. FIG. 4 (b) is an enlarged view showing a portion of FIG. 4 (a) in greater detail. A bend relieving section 31 is provided, which is a difference from the structure shown in FIGS. 2 (a) and 2 (b). The other structure is the same as that of FIGS. 2(a) and 2(b).

As shown in FIG. 4 (a), an integrated spacer 13 has on its entire rear surface or a part thereof an adhesive region ADH1, and the rear surface is affixed to a flexible circuit substrate 11 through, for example, a two-faced tape or adhesive. Furthermore, an adhesive region ADH2 is provided on thick regions 131 (hatched areas shown in FIG. 3) and is affixed to the base region 110 through a two-faced tape (or adhesive). The electronic component 121 shown in the figure is surrounded and protected by the thick region 131.

A thin region 132 of the integrated spacer 13 supports bending regions of the flexible circuit substrate 11, and plays a role of protecting the flexible circuit substrate 11 particularly with respect to its bending end regions 21 and 22 that can sharply bent.

Furthermore, the thin region 132 of the integrated spacer 13 is provided with a bend relieving section 31 between the bending end regions 21 and 22. The bend relieving section 31 is a slacked portion in the thin region 132, which is not bonded to the flexible circuit substrate 11. This alleviates stretching stresses to be generated when the flexible circuit substrate 11 is bent. In other words, this alleviates a restoration force (a force to return to its original state) that is generated when the flexible circuit substrate 11 is bent together with the thin region 132 of the integrated spacer 13 stacked thereon.

The mounting regions 112 and 113 are successively bent on top of the other such that the other electronic components 122 and 123 and the small sized electronic components 124 and 125 are disposed above the base region 110 in a similar manner as described above although not shown. As a result, the flexible circuit substrate 11 is bent in a predetermined order together with the integrated spacer 13 (the thick regions 131) such that the electronic components 121–125 are stacked in layers. As a result, the thick regions 131 of the integrated spacer 13 and the flexible circuit substrate (its rear surface) are affixed to each other by the two-faced tape or the like to form a three-dimensional mounting module.

In accordance with the second embodiment of the present invention, at the time when the electronic components (121–123 and others) are mounted on the flexible circuit substrate 11, an operation as a module product can likewise be conducted. Accordingly, measurement and examination can be conducted before they are assembled into a three-dimensional mounting module.

Moreover, the integrated spacer 13 that can be assembled into a three-dimensional mounting module can be mounted on the flexible circuit substrate 11 in one lot. Then, the mounting regions 111–113 are folded together with the integrated spacer 13 and fixed on top of the other to realize a three-dimensional mounting module of the electronic components (121–123 and others). Also, the provision of the bend relieving sections 31 in regions where the flexible circuit substrate 11 needs to be bent creates an advantage of improving the bending accuracy.

As a result, the assembly characteristic (readiness and accuracy in assembly) of a three-dimensional mounting module is substantially improved, and the number of work steps can be reduced. This results in an excellent workability in repair work (or re-work). The assembly characteristic is improved and the number of parts is reduced compared to spacers of a separated type. This contributes to the reduction of costs. Furthermore, a greater degree of freedom in selection and combination of different types of ICs is available and a most electrically optimized module can be obtained in view of the fact that a plurality of peripheral elements can be mounted.

Figure 5:
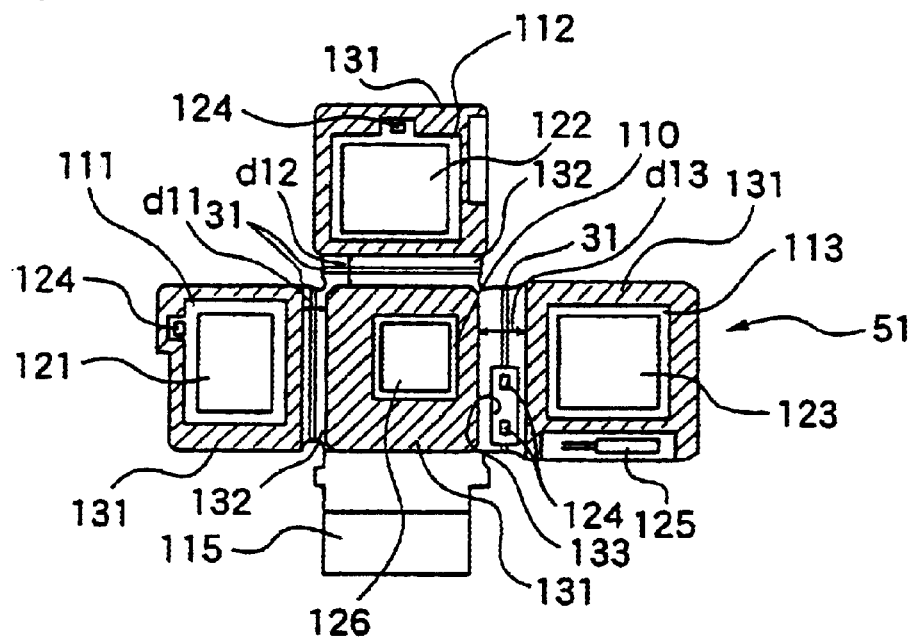
FIGS. 5 (*a*) and (*b*) show a structure of a semiconductor device in accordance with a third embodiment of the present invention, respectively, wherein FIG. 5 (*a*) shows a plan view before assembly, and FIG. 5 (*b*) shows a cross-sectional view of the general structure of a three-dimensional mounting module after assembly.
Figure 5:
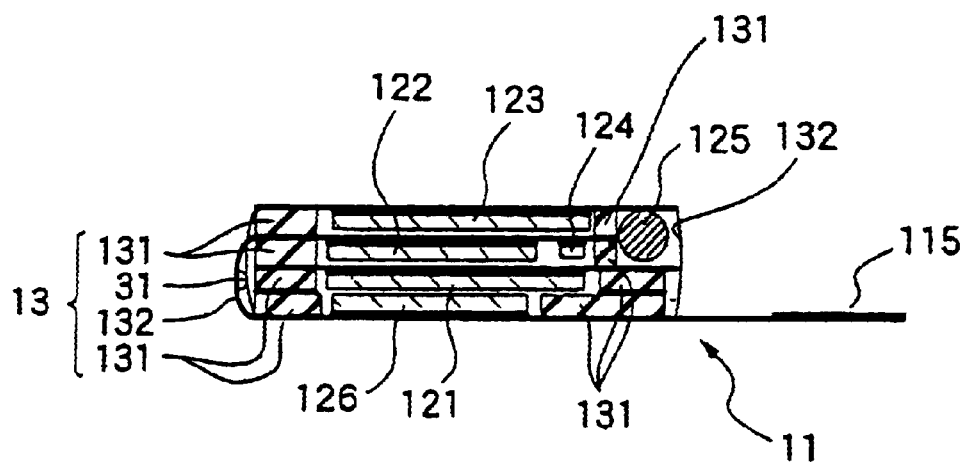

FIGS. 5 (a) and (b) show a structure of a semiconductor device in accordance with a third embodiment of the present invention, respectively, wherein FIG. 5 (a) shows a plan view before assembly, and FIG. 5 (b) shows a cross-sectional view of the general structure of a three-dimensional mounting module after assembly. Elements that are the same as those of the second embodiment are referred to by the same reference numbers and the description thereof is omitted.

In the third embodiment of the present invention, a flexible circuit substrate 51 is different from that of the second embodiment. As shown in the figure, an electronic component 126 is also mounted on the base region 110 of the flexible circuit substrate 51. Accordingly, the integrated spacer 13 is also provided with a thick region 131 on the base region 110 corresponding to the electronic component 126.

Also, in view of the fact that the electronic components 121–123 are successively stacked over the electronic component 126 in layers, in the integrated spacer 13, distances d11–d13 between the thick region 131 on the base region 110 and the thick regions 131 on the mounting regions 111–113, respectively are made different from one another. With this structure, the flexible circuit substrate 51 is folded over in a predetermined order together with the integrated spacer 13 (the thick regions 131), and the electronic components 121–125 are stacked and fixed in layers in a similar manner as described in the first embodiment (see FIG. 5 (b)).

Figure 6:
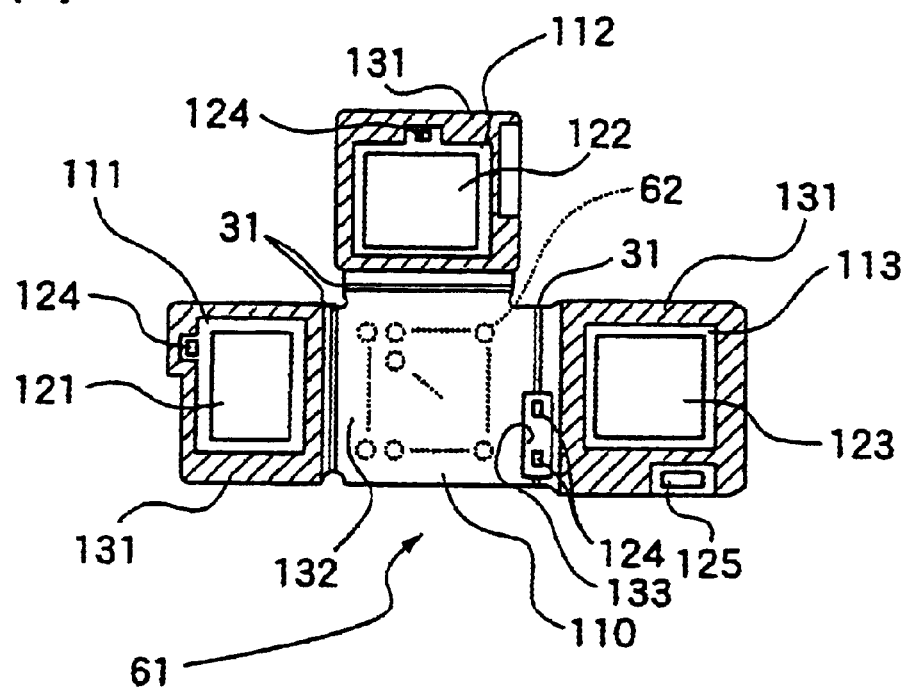
FIGS. 6 (*a*) and (*b*) show a structure of a semiconductor device in accordance with a fourth embodiment of the present invention, wherein FIG. 6 (*a*) shows a plan view before assembly, and FIG. 6 (*b*) shows a cross-sectional view of the general structure of a three-dimensional mounting module after assembly.
Figure 6:
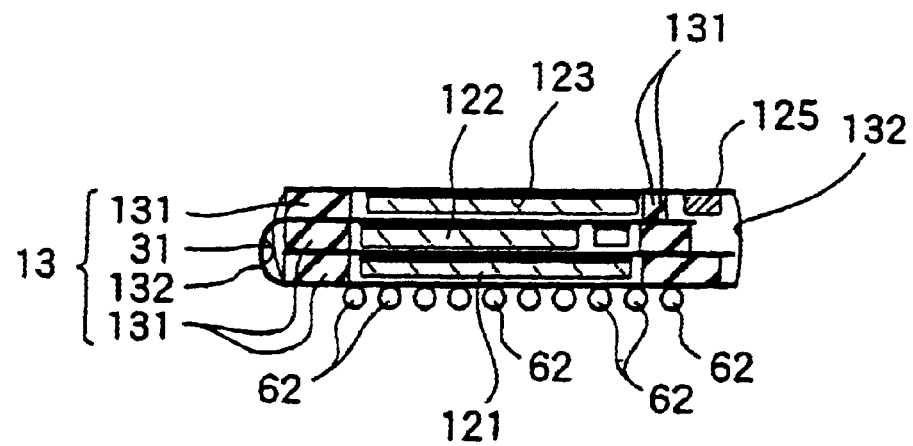

FIGS. 6 (a) and (b) show a structure of a semiconductor device in accordance with a fourth embodiment of the present invention, wherein FIG. 6 (a) shows a plan view before assembly, and FIG. 6 (b) shows a cross-sectional view of the general structure of a three-dimensional mounting module after assembly. Elements that are the same as those of the second embodiment are referred to by the same reference numbers and the description thereof is omitted.

In the fourth embodiment of the present invention, a flexible circuit substrate 61 is different from that of the second embodiment. As shown in the figure, external terminal sections (for example, ball electrodes) 62 indicated by broken lines are provided on the rear surface of the base region 110 of the flexible circuit substrate 61. In other words, in this structure, the external terminal section 115 described in the second embodiment (in FIG. 3), which is a connector terminal, is replaced with an array type electrode (62).

End sections of the conduction patterns, which are equivalent to external terminals (not shown), are connected to the external terminal sections (ball electrodes) 62 through via patterns (not shown) in the main surface of the flexible circuit substrate 61 in which the mounting regions (111–113) are provided.

Also, an electronic component 125 is a crystal, which is an SMD (Surface Mount Device) type instead of a cylinder type described above. An SMD type can be subject to a reflow when a three-dimensional module is mounted on a main substrate by solder and therefore is reliable.

The integrated spacer 13 is provided with thick regions 131 in accordance with the electronic components 121–125. Accordingly, the flexible circuit substrate 61 is folded over on top of the other in a predetermined order together with the integrated spacer 13 (with the thick regions 131), such that the electronic components 121–125 are stacked and fixed in layers in a similar manner as described in the first embodiment (see FIG. 6 (b)).

The electronic components 121–125 may be affixed in advance to the flexible circuit substrate 61 by an adhesive means such as a thermosetting type adhesive if required. This would contribute toward preventing, for example, the electronic components 124 and 125 that are solder-bonded from falling, when they are mounted on a main substrate by a reflow solder-bonding as a three-dimensional module. The adhesive means is not necessarily required because it depends on the temperature condition and the specific gravity of each electronic component. In any case, specified electronic components are preferably be bonded without interfering with the spacer 13.

In one possible structure, mounting regions may be provided along all of the four edges of the periphery of the base region 110. In such a case, electronic components are stacked in layers in a predetermined order together with an integrated spacer including thick regions and a thin region and affixed together in the same manner as described in the first embodiment.

Both of the third and fourth embodiments described above are made in pursuit of a high-density mounting structure. In accordance with these embodiments, at the time when the electronic components are mounted on the flexible circuit substrate 51 or 61, an operation as a module product can likewise be conducted. Accordingly, measurement and examination can be conducted before they are assembled into a three-dimensional mounting module.

Moreover, the integrated spacer 13 that can be assembled into a three-dimensional mounting module can be mounted on the flexible circuit substrate 51 or 61 in one lot. Then, the mounting regions are folded together with the integrated spacer 13 and affixed on top of the other to realize a three-dimensional mounting module of the electronic components. Also, the provision of the bend relieving sections 31 in regions where the flexible circuit substrate 51 or 61 needs to be bent improves the accuracy in bending.

In accordance with each of the embodiments described above, an integrated spacer substantially improves the assembly characteristic (readiness and accuracy in assembly) of a three-dimensional mounting module, and reduces the number of work steps. This provides a three-dimensional mounting module having an excellent workability in repair work (or re-work). The assembly characteristic is improved and the number of parts is reduced compared to spacers of a separated type. This contributes to the reduction of costs. Furthermore, a greater degree of freedom in selection and combination of different types of ICs is available and a most electrically optimized module can be obtained in view of the fact that a plurality of peripheral elements can be mounted.

As a result, there is provided a most electrically optimum semiconductor device with a high degree of freedom can be provided with a highly reliable three-dimensional mounting module using a flexible circuit substrate, in which the readiness and controllability are attained in assembling the high density three-dimensional mounting module, and an excellent workability in repair work (or re-work).

What is claimed is:

1. A semiconductor device comprising:
   a flexible circuit substrate having a base region and one or more mounting regions continuously provided at a peripheral edge of the base region, wherein each of the mounting regions is foldable over the base region;
   electronic components mounted corresponding with the mounting regions;
   a stackable layered support body including a thick first region and a foldable thin second region that is formed with the first region in one piece, wherein the thick first region has an outer frame provided in a manner to protect each of the electronic components; and
   a bonding member for affixing the stackable layered support body with the flexible circuit substrate in one piece in such a manner that the electronic components mounted on the flexible circuit substrate are stacked in layers.

2. The semiconductor device according to claim 1, wherein the flexible circuit substrate further includes:
   an external terminal region that is provided along a portion of a periphery of the base region in a region free of mounting regions.

3. The semiconductor device according to claim 1, wherein the flexible circuit substrate further includes:
   an external terminal region that is provided on a surface of the base region.

4. The semiconductor device according to claim 1, wherein the stackable layered support body has a structure that surrounds a periphery of some of the electronic components in the first region.

5. The semiconductor device according to claim 1, wherein the stackable layered support body has a structure that partially follows along the periphery of some of the electronic components with respect to the first region.

6. The semiconductor device according to claim 1, wherein the stackable layered support body is provided with a bend relieving section in the second region.

7. The semiconductor device according to claim 1, further comprising a structure in which an electronic component is mounted in the base region.

8. The semiconductor device according to claim 1, wherein the electronic components are mounted face down.

9. The semiconductor device according to claim 8, wherein the face down mounting of the electronic components is performed by solder-bonding bump electrodes.

10. The semiconductor device according to claim 1, wherein the flexible circuit substrate is formed from a polyimide.

11. A semiconductor device comprising:
    a flexible circuit substrate having a base region and one or more mounting regions continuously provided at a peripheral edge of the base region, wherein each of the mounting regions is foldable over the base region;
    electronic components mounted corresponding with the mounting regions;
    a stackable layered support body including a thick first region and a foldable thin second region that is formed with the first region in one piece, wherein the thick first region has an outer frame provided in a manner to protect each of the electronic components; and
    means for affixing the stackable layered support body with the flexible circuit substrate in one piece in such a manner that the electronic components mounted on the flexible circuit substrate are stacked in layers.

12. A method for manufacturing a semiconductor device, comprising:
    providing a flexible circuit substrate having a base region and one or more mounting regions continuously provided at a peripheral edge of the base region, wherein each of the mounting regions is foldable over the base region;
    mounting electronic components in corresponding with the mounting regions;
    forming a stackable layered support body including a thick first region and a foldable thin second region with the first region in one piece, wherein the thick first region has an outer frame provided in a manner to protect each of the electronic components; and
    affixing the stackable layered support body with the flexible circuit substrate in one piece with a bonding member in such a manner that the electronic components mounted on the flexible circuit substrate are stacked in layers.

13. The method according to claim 12, further comprising providing an external terminal along a portion of a periphery of the base region of the flexible circuit substrate in a region free of mounting regions.

14. The method according to claim 12, further comprising providing an external terminal region on a surface of the base region on the flexible circuit substrate.

15. The method according to claim 12, further comprising forming the stackable layered support with a structure that surrounds a periphery of some of the electronic components in the first region.

16. The method according to claim 12, further comprising forming the stackable layered support body with a structure that partially follows along the periphery of some of the electronic components with respect to the first region.

17. The method according to claim 12, further comprising providing the stackable layered support body with a bend relieving section in the second region.

18. The method according to claim 12, further comprising mounting the electronic components face down.

19. The method according to claim 18, further comprising solder-bonding bump electrodes to mount the face down electronic components.

20. The method according to claim 12, further comprising forming the flexible circuit substrate out of a polyimide.

21. The semiconductor device according to claim 3, wherein the external terminal region is formed in an array manner in the base region of the flexible circuit substrate.

* * * * *